(12) United States Patent
Givant et al.

(10) Patent No.: US 8,374,045 B2
(45) Date of Patent: Feb. 12, 2013

(54) METHODS CIRCUITS DEVICES AND SYSTEMS FOR OPERATING AN ARRAY OF NON-VOLATILE MEMORY CELLS

(75) Inventors: Amichai Givant, Ha'ayin (IL); Ran Sahar, Netanya (IL)

(73) Assignee: Spansion Israel Ltd, Netanya (IL)

( * ) Notice: Subject to any disclaimer, the term of this patent is extended or adjusted under 35 U.S.C. 154(b) by 162 days.

(21) Appl. No.: 12/926,718

(22) Filed: Dec. 7, 2010

(65) Prior Publication Data

US 2011/0134713 A1    Jun. 9, 2011

(51) Int. Cl.
*G11C 7/02*    (2006.01)

(52) U.S. Cl. ............. 365/210.1; 365/185.21; 365/185.2; 365/63

(58) Field of Classification Search ............... 365/210.1, 365/185.21, 185.2, 63, 207, 205
See application file for complete search history.

(56) References Cited

U.S. PATENT DOCUMENTS 7,567,475 B2 *   7/2009  Confalonieri .............. 365/210.1
8,189,363 B2 *   5/2012  Tsuchida et al. ........... 365/210.1

* cited by examiner

*Primary Examiner* — David Lam
(74) *Attorney, Agent, or Firm* — Eitan, Mehulal & Sadot

(57) ABSTRACT

Disclosed are methods, circuits, devices and systems for operating one or more non-volatile memory (NVM) cells within an array of NVM cells. According to embodiments, there may be provided a nonvolatile memory (NVM) device comprising an array of NVM data cells including one or more border/periphery data cells and one or more non-periphery cells. Array control circuitry may be adapted to gauge a state of the one or more periphery data cells differently than non-periphery data cells.

20 Claims, 9 Drawing Sheets

FIG. 2 – MEMORY ARRAY DESCRIPTION

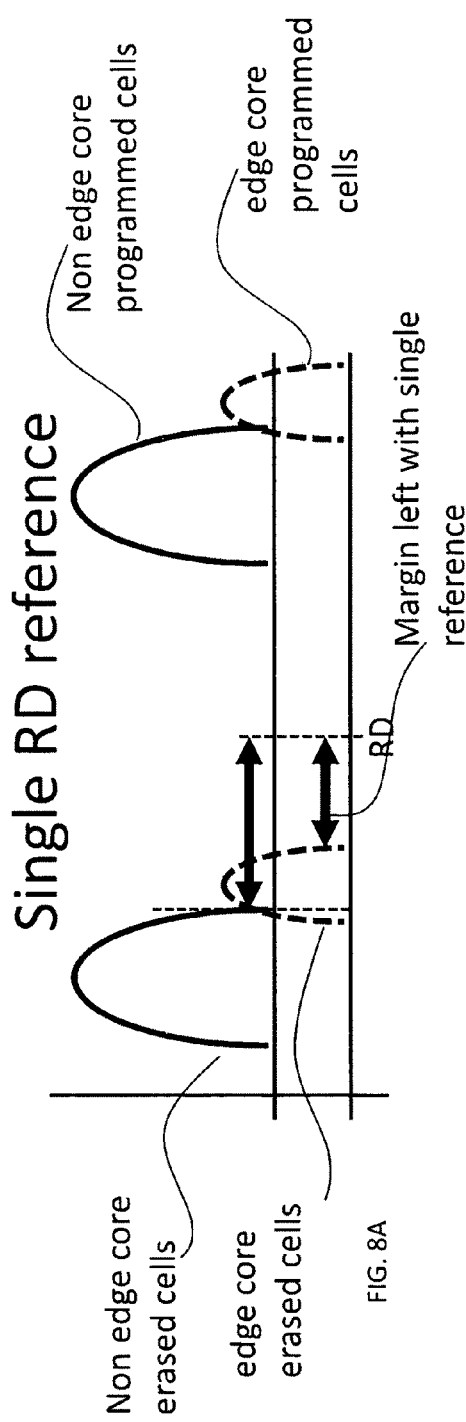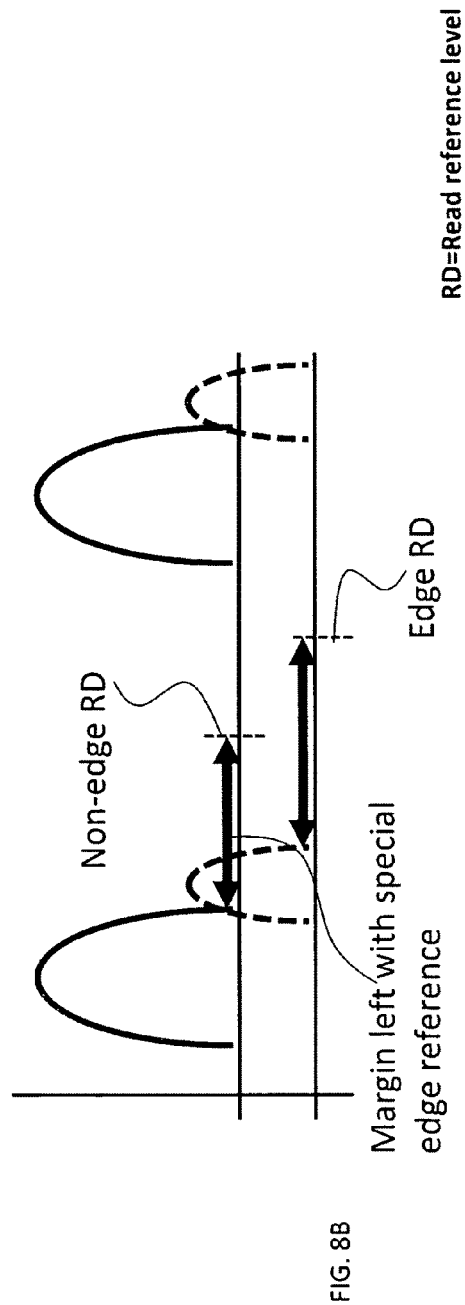
FIG. 8A
FIG. 8B

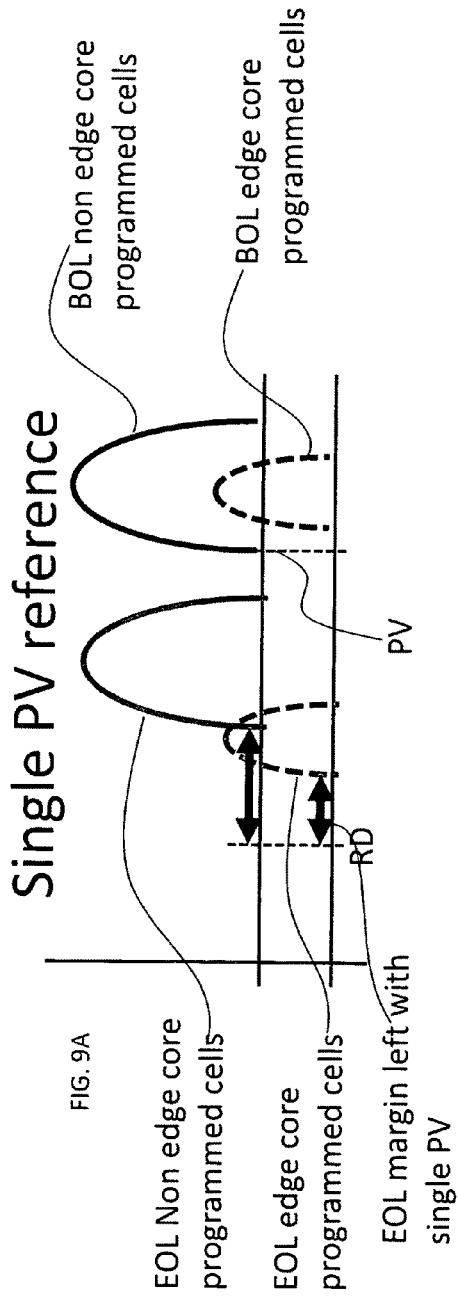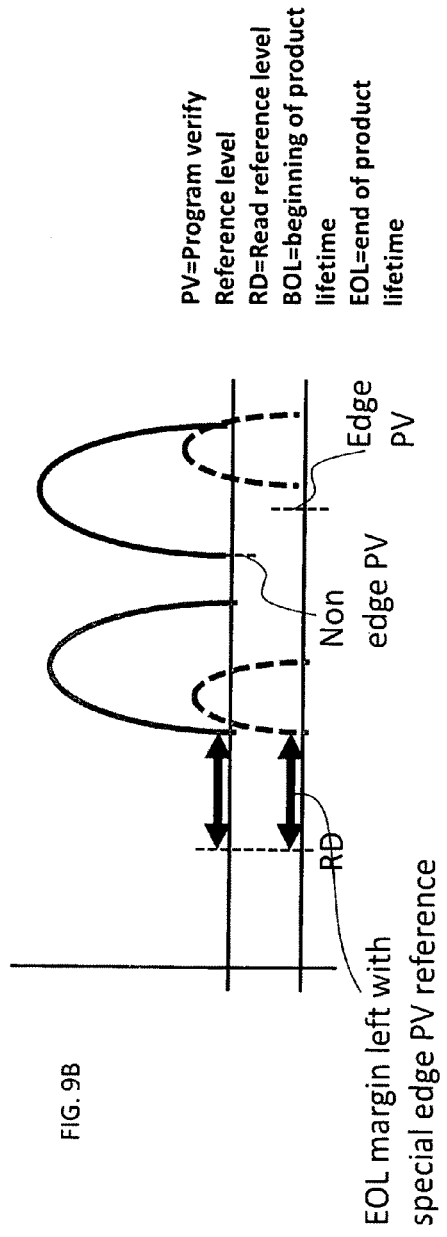
FIG. 9A
FIG. 9B

METHODS CIRCUITS DEVICES AND SYSTEMS FOR OPERATING AN ARRAY OF NON-VOLATILE MEMORY CELLS

FIELD OF THE INVENTION

The present invention relates generally to the field of Non-Volatile Memory ("NVM") arrays and devices. More specifically, the present invention relates to methods, circuits, devices and systems for operating an array of non-volatile memory cells including border/periphery NVM cells.

BACKGROUND

Nonvolatile memories are usually constructed from one or more arrays of cells, in which each cell may store the value of one or more logical bit.

As is well known in the art, non-volatile memory (NVM) cells may have bits stored therein that may be read, such as by means of a sense amplifier. In general, the sense amplifier determines the logical value stored in the cell by comparing the output of the cell with a reference level. If the current output is above the reference, the cell is considered erased (with a logical value of, for example, 1) and if the current output is below the reference, the cell is considered programmed (with a logical value of, for example, 0). In terms of threshold voltage of the cell itself, programming a cell increases the threshold voltage of the cell, whereas erasing decreases the threshold voltage.

Different current levels are associated with different logical states, and a NVM cell's current level may be correlated to the amount of charge stored in a charge storage region of the cell.

Generally, in order to determine whether an NVM cell is at a specific state, for example erased, programmed, or programmed at one of multiple possible program states within a multi-level cell ("MLC"), the cell's current level is compared to that of a reference cell whose current level is preset at a level associated with the specific state being tested for.

In some cases, a "program verify" reference cell with a current set at a level defined as a "program verify" level may be compared to a cell being programmed (i.e. charged) in order to determine whether a charge storage area of the cell has been sufficiently charged so as to be considered "programmed."

In the case where the cell is an MLC, the cell may have several possible program states, and one or more program reference cells, with one or more different current levels corresponding to each of the NVM cell's possible program states, which may be used to determine the state of the MLC.

For reading a cell, the current levels of one or more "read verify" reference cells may be compared to the current of the cell being read. An "erase verify" reference cell with a current set at a level defined as an "erase verify" level may be compared against a memory cell during an erase operation in order to determine when the memory cell's charge storage area has been sufficiently discharged so as to consider the cell erased.

Enough margins should be kept between the different reference levels so that the logical state interpretation is free of mistakes under the different operation conditions (e.g. temperature and voltages changes and retention of the stored charge). In some cases it is common to define the margin between the read level and the erase verify level as the "erase margin" and the margin between the read level and the program verify level as the "program margin". The margin between the initial NVM cell level and the lowest reference level, usually the erase verify level, is referred to as 'cycle margin' ("CM"). Other margins and levels may be defined for different purposes. In a MLC NVM, few margins and levels are defined to assure a correct operation and interpretation of the different levels.

SUMMARY OF THE INVENTION

The present invention includes methods, circuits, devices and systems for operating one or more non-volatile memory ("NVM") cells of an NVM array. According to some embodiments of the present invention, there may be provided a non-volatile memory ("NVM") which may include an array of NVM data cells. NVM data cells which are located at or near an edge or periphery of the NVM array, or near the edge or periphery of one of the NVM array segments, may be categorized or termed as periphery NVM cells. A periphery data cell may be located at or near an array segment edge/periphery, such that at least one side of the cell is not border by another NVM cell. Conversely, NVM data cells which are not located at or near an edge or periphery of the NVM array, or not near the edge or periphery of one of the NVM array segments, may be categorized or termed as non-periphery NVM cells. A non-periphery data cell may be located at some distance from an array segment edge or periphery, such that all sides of the cell are border by another NVM cell.

According to further embodiments, an array may include several periphery areas and/or types (e.g. edge of array, edge of a segment, border of an isolation area, etc.). Accordingly, there may be defined several categories of periphery NVM cells.

According to some embodiments of the present invention, a logical state of an NVM data cell in the NVM array may require evaluation and/or verification. The logical state of an NVM data cell may be evaluated/verified by comparing a current output of the data cell against a current output of a reference NVM cell (or reference structure) while both the data cell and the reference cell/structure experience the same or similar voltages applied to their respective corresponding terminals (e.g. gate, source and drain). According to some embodiments, a periphery NVM cell and a non-periphery NVM cell of the same array and programmed to the same logical state may exhibit different current output characteristics while experiencing the same terminal voltages. According to some embodiments, two separate periphery NVM cells, of two separate periphery categories/types, programmed to the same logical state may exhibit different current output characteristics while experiencing the same terminal voltages.

According to some embodiments of the present invention, there may be provided a nonvolatile memory device with one or more sets of reference cells or reference structures. According to some embodiments of the present invention, two or more reference cells/structures associated with the same given logical state may have different surroundings. For example, one of the reference cells/structures associated with the given logical state may be at or near a periphery (e.g. itself a periphery cell) of an array segment while the other may be at some distance from any array segment periphery (e.g. itself a non-periphery cell). According to further embodiments of the present invention, the non-periphery reference cell/structure may be selected and/or used to evaluate the logical state of a non-periphery data cell, while the periphery reference cell may be selected and/or used to evaluate the state of a periphery data cell. According to further embodiments, there may be provided several types or categories of periphery reference cells/structures and the category or type of periphery reference cell/structure selected/used to evaluate a given periphery data cell may correspond to the type or category of the given periphery data cell.

According to yet further embodiments, various configuration setting adjustments may be made to a reference cell/structure and/or sensing path in order to compensate for output current variations of a periphery NVM cell of one or more periphery cell types or categories.

According to some embodiments, surroundings (i.e. surrounding structures) of some of the reference cells in the reference cell set may be different from each other. According to some embodiments of the present invention, the nearby surrounding structure of one or more reference cell(s) may be substantially similar to the nearby surrounding structure of one or more data cells in the memory array. According to some embodiments, the logical state of a data cell may be verified by comparing the current of the data cell to current of a reference cell which may have similar nearby surroundings. According to some embodiments, the logical state of a data cell may be verified by comparing the current of the data cell to current of a reference cell which may be designed to behave similarly to the cell having a similar nearby surroundings.

According to some embodiments, a nonvolatile memory (NVM) device may include an array of NVM data cells comprised of one or more periphery data cells and one or more non-periphery cells. Array control circuitry may be adapted to evaluate a state of the one or more periphery data cells differently than non-periphery data cells. There may be provided a set of NVM reference structures adapted to evaluate a state of one or more data cells, wherein the set of NVM reference structures includes at least one reference structure for evaluating a state of a periphery data cell and at least one reference structure for evaluating a state of a non-periphery data cell. The array control circuitry may include control logic adapted to select a reference structure associated with periphery NVM cells when evaluating a state of a periphery data cell. The array control circuitry may include control logic adapted to select a reference structure associated with non-periphery NVM cells when evaluating a state of a non-periphery data cell.

The reference structures may be NVM reference cells. NVM reference cells associated (e.g. selected/used) with periphery NVM data cells may be a periphery NVM cells located at a periphery of the NVM array. NVM reference cell associated with non-periphery NVM data cells may be non-periphery NVM cells surrounded on four sides by other NVM cells.

According to embodiments, the array control circuitry may be further adapted to evaluate a state of one or more periphery data cells using a second sense path configuration different from a first sense path configuration used for evaluating non-periphery cells. The array control circuitry may be adapted to modify one or more sense path configuration factors selected from the group of factors consisting of: (1) reference structure selection, (2) sense path routing, (3) sense amplifier selection, (4) sense amplifier settings, (5) reference structure voltage offset element selection, (6) reference structure current offset element selection, (7) data cell voltage offset element selection, and (8) data cell current offset element selection. The control circuitry may be adapted to determine whether a given NVM cell to be evaluated is a periphery cell based on a parameter of an array address of the given NVM cell.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

FIG. 8 shows an example of read margin improvement using a separate read reference for edge memory cells according to some embodiments of the invention; and FIG. 9 shows an example of end-of-life read margin improvement using a separate program verify reference for edge memory cells according to some embodiments of the invention.

Figure 1:
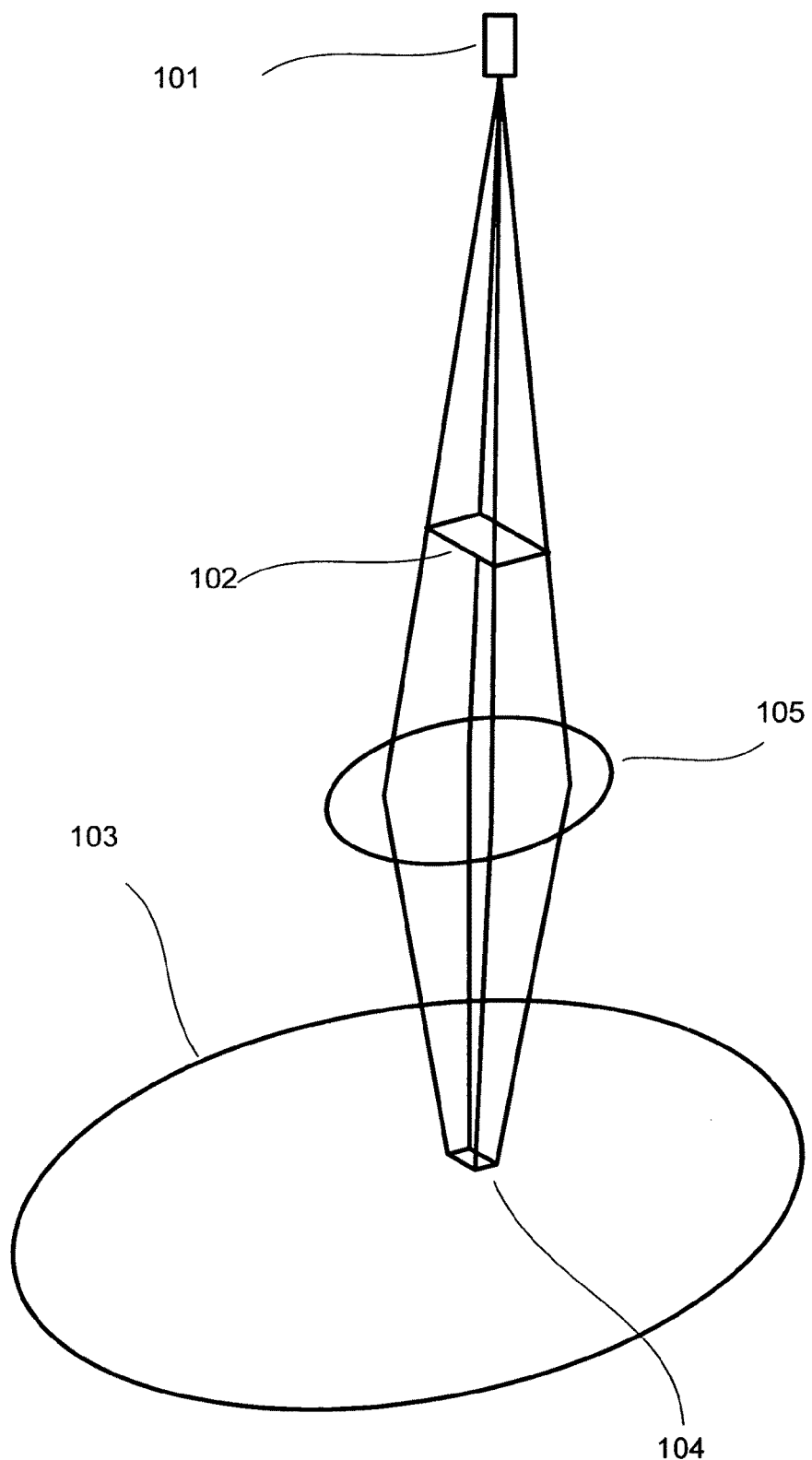
FIG. 1 shows a schematic example of a lithography process.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

Glossary

Unless otherwise noted, or as may be evident from the context of their usage, any terms, abbreviations, acronyms or scientific symbols and notations used herein are to be given their ordinary meaning in the technical discipline to which the disclosure most nearly pertains. The following terms, abbreviations and acronyms may be used throughout the descriptions presented herein and should generally be given the following meaning unless contradicted or elaborated upon by other descriptions set forth herein.

Bit-lines strapping an area in the array for electrical connection between buried bit-lines and upper metal layers.

Dopant element introduced into semiconductor to establish either p-type (acceptors) or n-type (donors) conductivity; common dopants in silicon: p-type, boron, B, Indium, In; n-type phosphorous, P, arsenic, As, antimony, Sb.

GDS or GDS-II—Graphic Database System is a database file format which is the de facto industry standard for data exchange of integrated circuit or IC layout artwork. It is a binary file format representing planar geometric shapes, text labels, and other information about the layout in hierarchical form. The data can be used to reconstruct all or part of the artwork to be used in sharing layouts, transferring artwork between different tools, or creating photomasks. GDS II files may be the final output product of the IC design cycle and are given to IC foundries for IC fabrication.

multiplexer In electronics, a multiplexer or mux is a device that performs multiplexing: it selects one of many analog or digital data sources and outputs that source into a single channel.

Verify a read operation, after applying a program or erase pulse, that checks if the applied program or erase pulse moved the Vt to the target level (program-verify or erase-verify level).

Vt threshold voltage

Word-line or Wordline, (WL) A conductor normally connected to the gate of a memory cell transistor. The wordline may actually be the gate electrode of the memory cell.

X-Mux (X-Decoder) Selects and drives one word-line or a group of word-lines, out of all the word-lines it is connected to; therefore only the cells of the selected word-lines will have a possible current path, while all the other (the non selected) word-lines are disabled and will not have a current path. Usually the selection is depended on the address, and the mode of operation.

Y-Mux (Y-Decoder) Selects and drives one bit-line or a group of bit-lines, out of all the bit-lines it is connected to; therefore only the selected bit-lines will have a possible sinking or sourcing current path while all the other (the non selected) bit-lines are disabled and will not have a current path. Usually the selection is depended on the address, and the mode of operation.

DETAILED DESCRIPTION

In the following detailed description, numerous specific details are set forth in order to provide a thorough understanding of the invention. However, it will be understood by those skilled in the art that the present invention may be practiced without these specific details. In other instances, well-known methods, procedures, components and circuits have not been described in detail so as not to obscure the present invention.

Unless specifically stated otherwise, as apparent from the following discussions, it is appreciated that throughout the specification discussions utilizing terms such as "processing", "computing", "calculating", "determining", or the like, refer to the action and/or processes of a computer or computing system, or similar electronic computing device, that manipulate and/or transform data represented as physical, such as electronic, quantities within the computing system's registers and/or memories into other data similarly represented as physical quantities within the computing system's memories, registers or other such information storage, transmission or display devices.

Embodiments of the present invention may include apparatuses for performing the operations herein. This apparatus may be specially constructed for the desired purposes, or it may comprise a general purpose computer selectively activated or reconfigured by a computer program stored in the computer. Such a computer program may be stored in a computer readable storage medium, such as, but is not limited to, any type of disk including floppy disks, optical disks, CD-ROMs, magnetic-optical disks, read-only memories (ROMs), random access memories (RAMs) electrically programmable read-only memories (EPROMs), electrically erasable and programmable read only memories (EEPROMs), magnetic or optical cards, or any other type of media suitable for storing electronic instructions, and capable of being coupled to a computer system bus.

The processes and displays presented herein are not inherently related to any particular computer or other apparatus. Various general purpose systems may be used with programs in accordance with the teachings herein, or it may prove convenient to construct a more specialized apparatus to perform the desired method. The desired structure for a variety of these systems will appear from the description below. In addition, embodiments of the present invention are not described with reference to any particular programming language. It will be appreciated that a variety of programming languages may be used to implement the teachings of the inventions as described herein.

In the following detailed description, numerous specific details are set forth in order to provide a thorough understanding of the invention. However, it will be understood by those of ordinary skill in the art that the present invention may be practiced without these specific details. In other instances, well-known methods, procedures, and components have not been described in detail so as not to obscure the present invention.

For simplicity of the explanation, the terms "top", "bottom", "right", "left", "vertical" and "horizontal" will be used, these terms may be used just for clarity of the description of the invention, it should be noted that any orientation of the memory array may be applicable according to the invention. For example Right and Left may be interchangeable, or Right and Top, Left and Bottom may switch positions.

Manufacturing of semiconductor circuits, and among them, the manufacturing of nonvolatile memories, may be done using optical lithography techniques. In an optical lithography, the image of the circuit to be embedded on the die may be projected onto the die using a mask or reticle, which may contain an enlarged image of the circuits. The image on the mask may be defined in a standard format such as GDS-II. Each manufacturing process may have certain design rules which the GDS-II image should meet in order for the integrated circuit to operate properly. Some of the rules may relate to uniformity of the image, in order to eliminate or minimize optical distortion. When projecting an image of an array, such as an array of memory cells in a nonvolatile memory, the geometry of the projected cells on the array's border may be distorted and therefore the physical size of elements of the cell may be different than the physical size of similar elements in other cells located in other parts of the array (not near the border). In addition, cells at the array edge may have different chemical reaction speed during the etching process step than the chemical reaction speed of other cells which are not at the array edge and therefore the physical size of elements of the cell may be different than the physical size of similar elements in other cells located in other parts of the array. In some cases, there may be different doping migration at high temperatures between edge and non edge cells. In some cases there may even be different mechanical stress between edge and non edge cells. And in some cases the impact by cross interaction of neighboring cells may be different between edge cells and dense, non edge array cells. All of these reasons as well as other reasons that are a result of the different surrounding image or structural properties of an edge cell compared to a non edge cell may lead to different electrical behavior of cells at the array edge compared to the electrical behavior of non edge cells.

FIG. 1 shows an exemplary illustration of a GDS-II image printed on a lithography mask, being projected onto a die. The light source 101 illuminates the die 104 on the wafer 103. The mask 102 containing the GDS-II image is placed in between the light source and the wafer, so that the GDS-II image will be projected on the die through lens 105.

In memory arrays such as those in a nonvolatile memory, the GDS-II image may be very dense in the array area relative to the area which surrounds the array and some areas within the array such as isolation areas. Because of the different density of the surrounding area of some parts of the array relative to other parts, cells at the array edge may have electrical characteristics which may be different than cells which are located not at the array edge due to reasons such as explained above. For instance, due to optical phenomena, sharp changes in the image density may cause distortions in the projected image.

According to some embodiments of the present invention, there may be a nonvolatile memory array constructed from a matrix of N×M physical sectors. Each physical sector may be constructed from rows (word-lines) and columns (bit-lines) which may be orthogonal to the word-lines.

Figure 2:
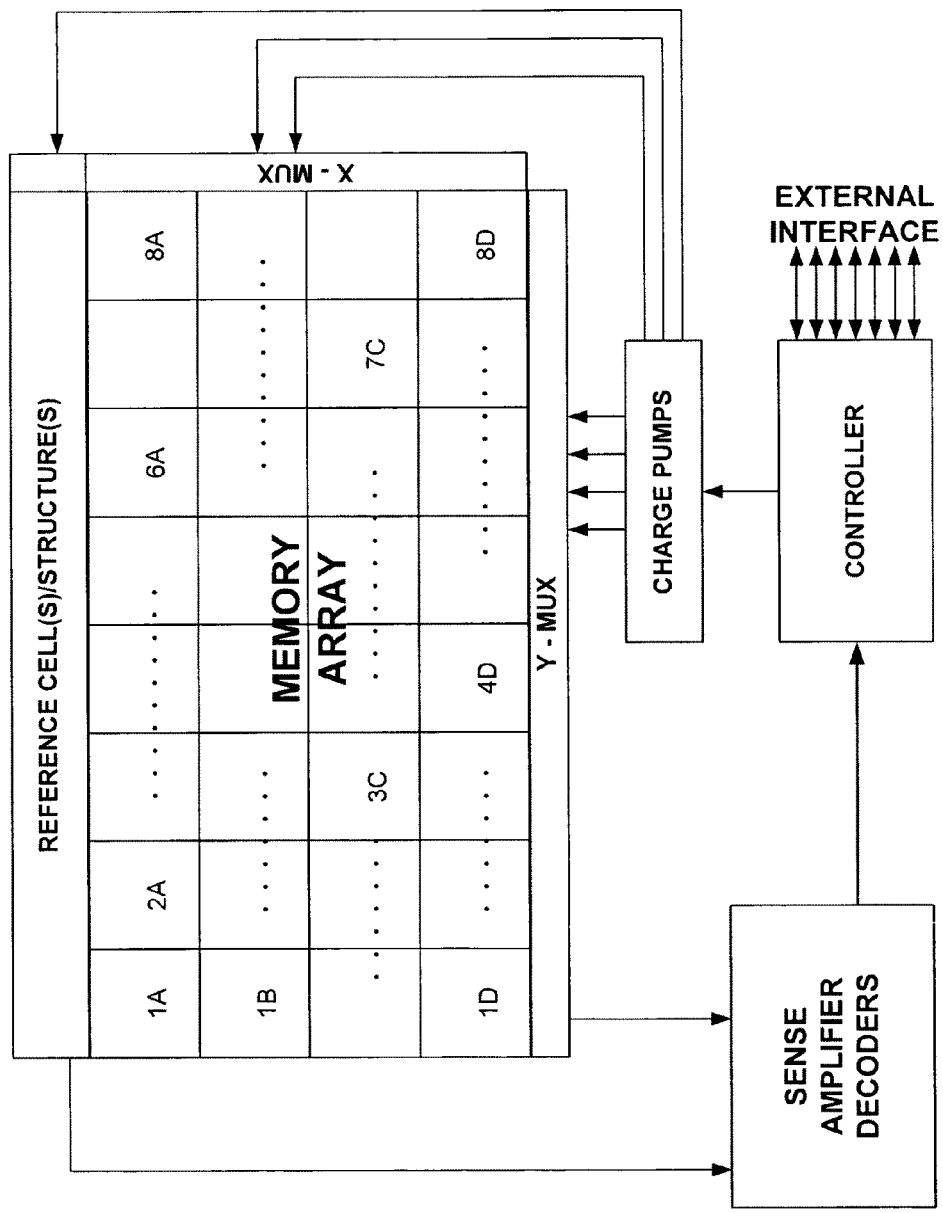
FIG. 2 shows a block diagram illustration of an exemplary circuit for operating a nonvolatile memory array.

FIG. 2 schematically illustrates an exemplary circuit for operating a nonvolatile memory array. In this example there is a memory array, which is constructed from 32 physical sectors arranged in a matrix of 4 vertical×8 horizontal physical sectors. The construction of the physical sectors is described in the examples shown in FIGS. 3, 4 and 5. The controller may receive an instruction from the external interface to read or write to a word in the memory array. When attempting to verify the logical state of any of the NVM cells of the array, the controller sends a signal to the charge pump or other electric signal source, which provides a current to the bits in the word to be read (a word-line signal), through the X and Y muxes and to a reference cell in the reference cell area. The sense amplifier decoder compares the current of the selected memory cell(s) with the current of a reference cell or cells located in the reference cell structure area and sends the comparison result back to the controller. According to the prior art, either the same word-line signal is applied to both the word-line of the NVM cells to be operated and to the reference cells against which the NVM cells are compared, or an offset word-line signal is applied to either the word-line of the NVM cells to be operated or to a global reference cell(s) against which the NVM cells may be compared.

Figure 3:
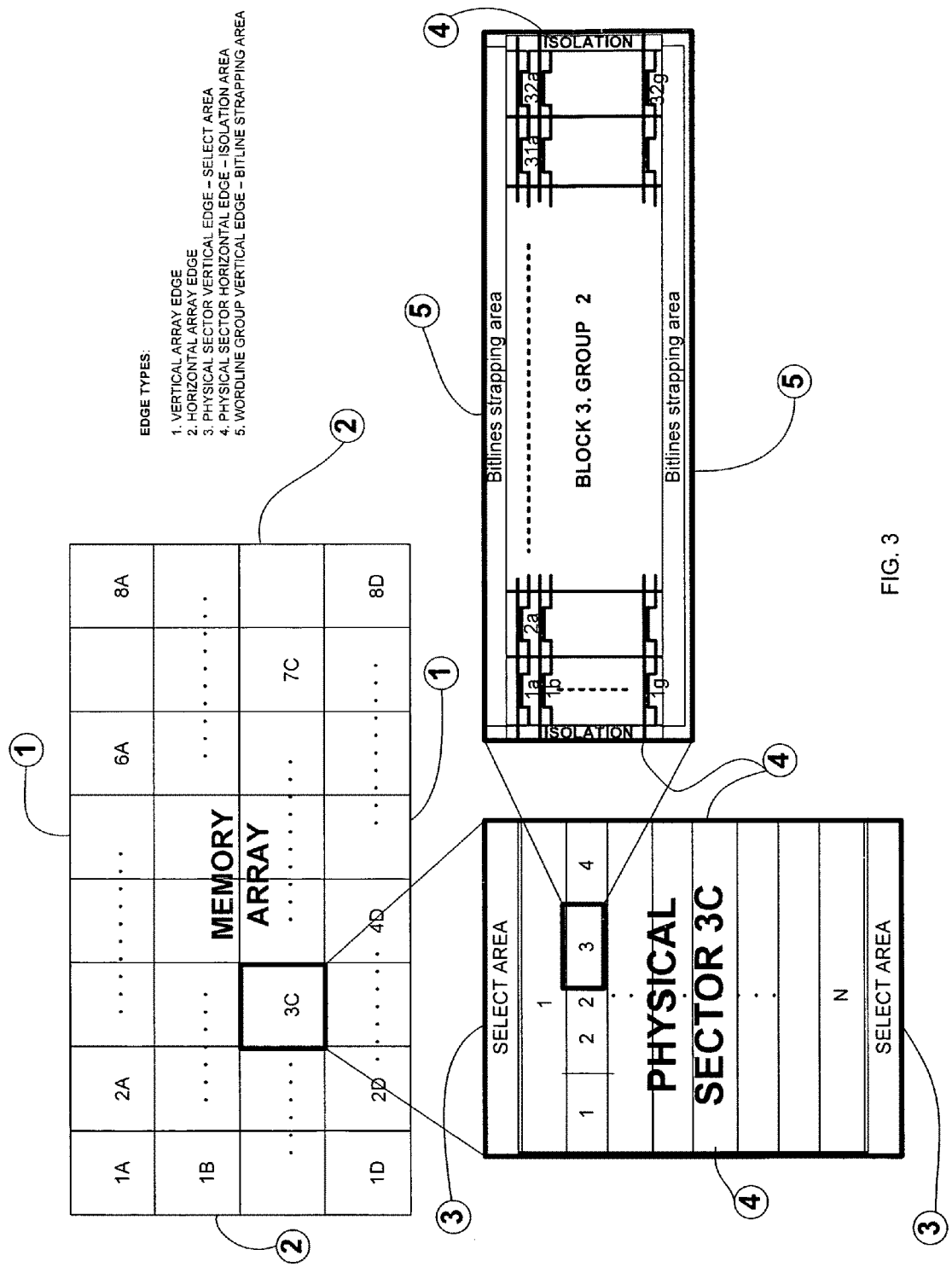
FIG. 3 shows some examples of basic edges in a memory array according to some embodiments of the present invention.

FIG. 3 is an enlargement of one of the physical sectors in the array shown in the example of FIG. 2. In this figure, an example of physical sector 3C is shown in detail. The physical sectors may be arranged as a matrix of one or more blocks separated between one another with bit-lines strapping area (for electrical connection between buried bitlines and upper metal layers) in the vertical direction, and one or more slices separated between one another with slice isolation areas in the horizontal direction. Each block is constructed from one or more word-lines in the vertical direction, and each word-line is constructed from one or more cells in the horizontal direction. The physical sector is bounded by a select transistors area on its top and bottom edges, and by slice isolation area on its right and left edges. Several Horizontal blocks may construct a word-line group. An exemplary enlargement of one slice of one word-line group (word-line group 2) is shown. In this enlargement there are 7 word-lines (a-g), and each word-line has 32 bits in a way that the first word-line includes bits 1a, 2a, 3a, . . . 32a. The second word-line includes bits 1b, 2b, 3b, . . . 32b. The seventh word-line includes bits 1g, 2g, 3g, . . . 32g.

Several exemplary basic types of cells are described in FIG. 3 according to their location within the memory array:
1) Cells at the top word-line of the top word-line group, of the top physical sector; and
cells at the bottom word-line of the bottom word-line group, of the bottom physical sector, are defined as vertical array edge cells.
2) The cells at the rightmost bit-lines at the rightmost slice of the rightmost physical sectors; and
the cells at the leftmost bit-lines at the leftmost slice of the leftmost physical sectors, are defined as horizontal array edge cells.
3) Cells at the top word-line of the top word-line group, of any physical sector other than the top physical sector; and
cells at the bottom word-line of the bottom word-line group, of any physical sector other than the bottom physical sector, are defined as physical sector vertical edge cells, or physical sector select area edge cells.
4) Cells at the rightmost bit-lines of any slice in any physical sector, other than the cells of the rightmost bit-lines of the rightmost slice in the rightmost physical sector; and
cells at the leftmost bit-lines of any slice in any physical sector, other than the cells of the leftmost bit-lines of the leftmost slice in the leftmost physical sector, are defined as physical sector horizontal edge cells, or physical sector isolation area edge cells.
5) Cells at the topmost word-line of any word-line group other than the top word-line group in any physical sector; and
cells at the bottommost word-line of any word-line group other than the bottom word-line group in any physical sector, are defined as word-line group vertical edge cells, or bit-line strapping area edge cells.

Based on these five basic cell types, other combinations may be defined.

Figure 4:
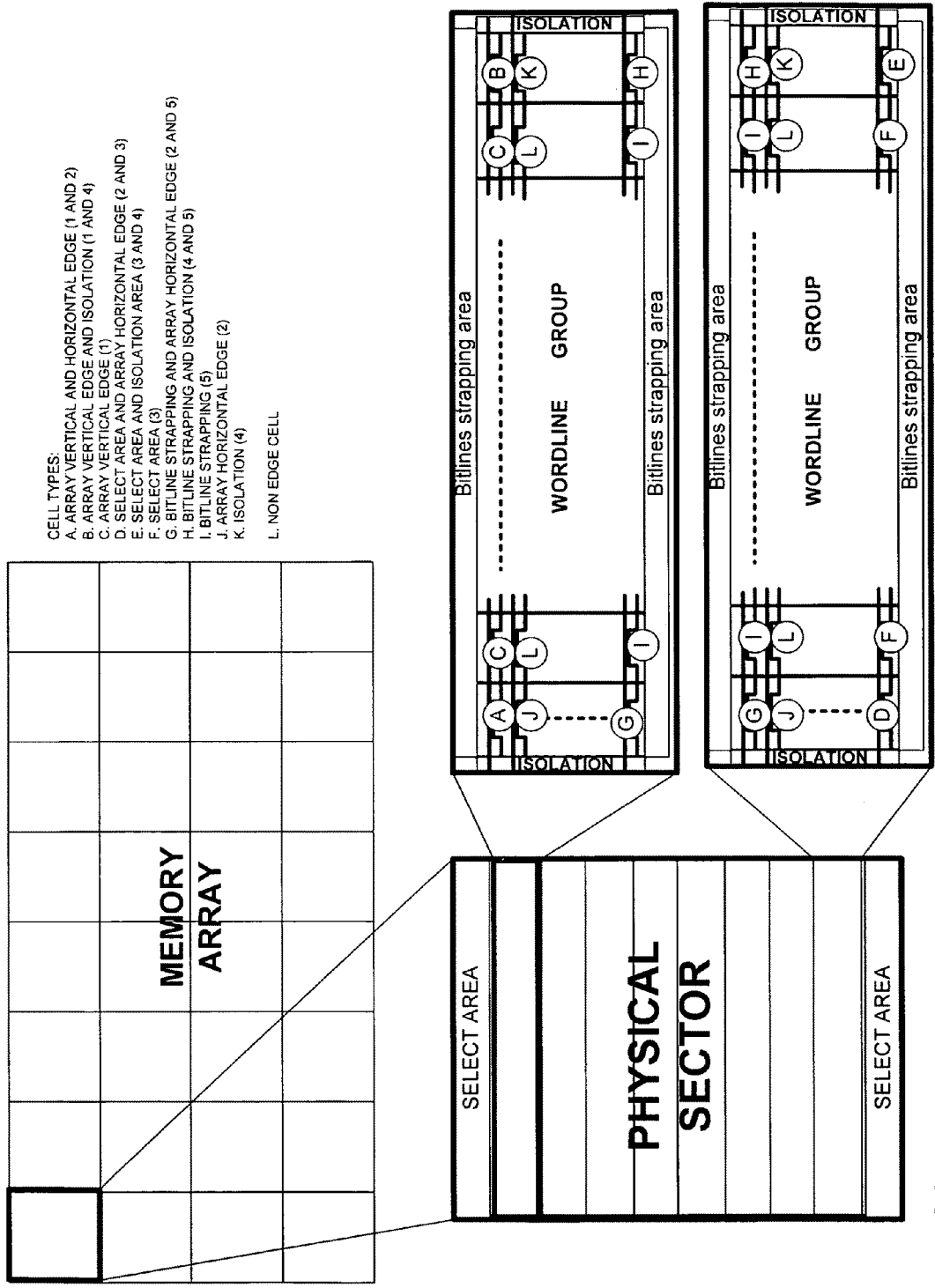
FIG. 4 shows some exemplary edges (basic edges and their combinations) in a memory array according to some embodiments of the present invention.

FIG. 4 shows some exemplary cell types which are based upon the basic cell types shown in FIG. 3.
I) Array vertical and horizontal edge cells (cells that meet the criteria of type 1 and type 2).
II) Array vertical edge and isolation (cells that meet the criteria of type 1 and type 4).
III) Array vertical edge (basic cell type 1).
IV) Select area and array horizontal edge (cells that meet the criteria of type 2 and type 3).
V) Select area and isolation area (cells that meet the criteria of type 3 and type 4).
VI) Select area (basic cell type 3).
VII) Bit-line strapping and array horizontal edge (cells that meet the criteria of type 2 and type 5).
VIII) Bit-line strapping and isolation (cells that meet the criteria of type 4 and type 5).
IX) Bit-line strapping (basic cell type 5).
X) Array horizontal edge (basic cell type 2).
XI) Isolation (basic cell type 4).
XII) Non edge cell.

Each of the abovementioned cell types may have a different uniformity of the surrounding area of the cell. Cells of the same cell type may have substantially similar uniformity of the surrounding area.

Figure 5:
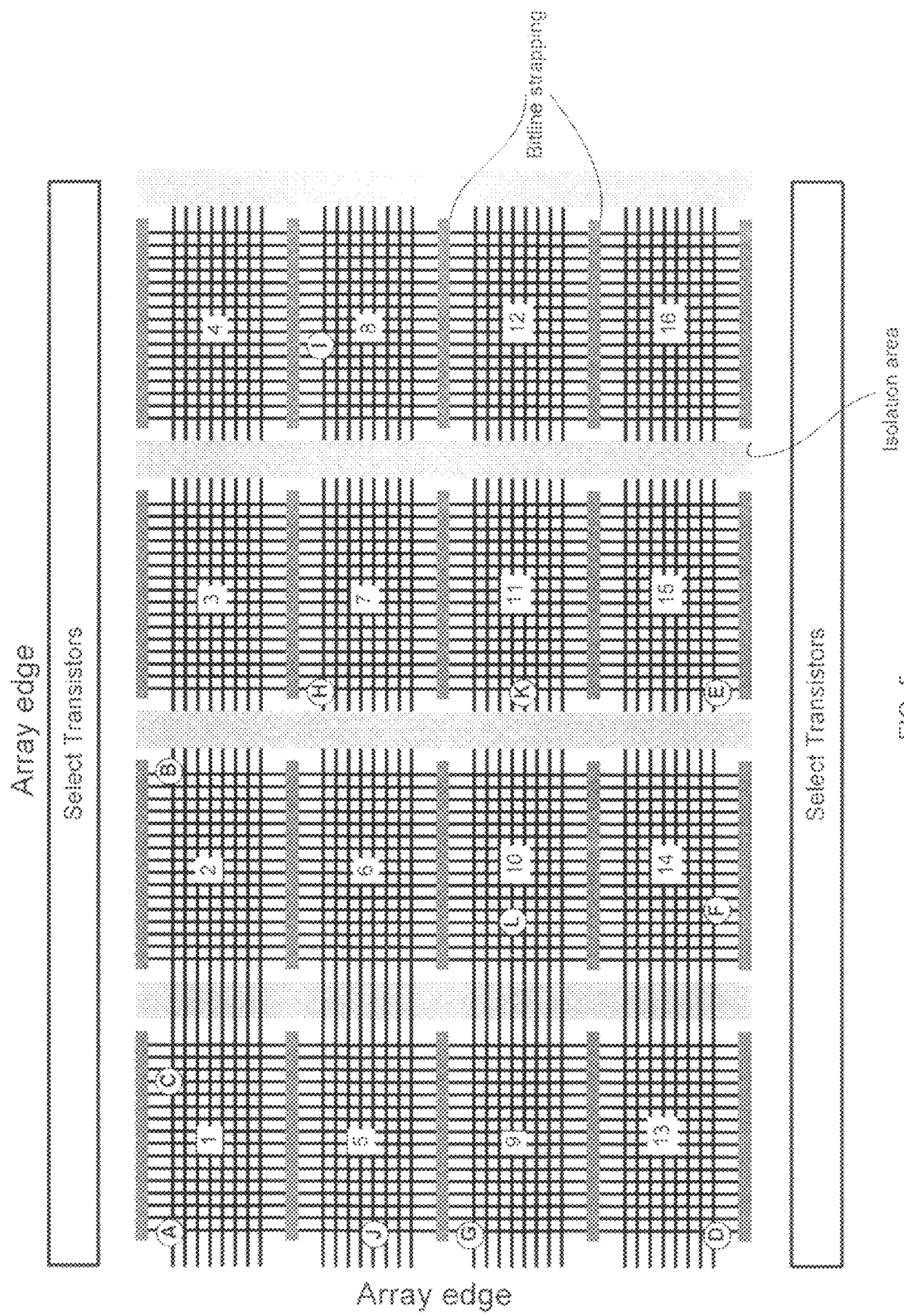
FIG. 5 shows another exemplary illustration of edges in a memory array according to some embodiments of the present invention.

FIG. 5 is an exemplary schematic description of a physical sector in a nonvolatile memory array according to some embodiments of the invention. According to this example, the physical sector is constructed from a matrix of 16 blocks which are divided into 4 slices of 4 block. It can be noted that the physical sector in this example is located at the top-left corner of the memory array.

Blocks 6, 7, 8, 10, 11, 12 are encompassed by bit-line contact strapping at the top and bottom of the block, and by isolation areas to the right and left of the block. Blocks 5, 9 are encompassed by bit-line contact strapping at the top and bottom of the block, and by the left edge of the physical memory array. Blocks 2, 3, 4 are at the top edge of the physical memory array and encompassed by isolation areas to the right and left of the block and by contact strapping at the bottom of the block and the edge of the memory array, near the select transistors at the top of the block. Blocks 14, 15, 16 are at the bottom of the physical sector and encompassed by isolation areas to the right and left of the block and by contact strapping at the top of the block and by a sector edge near the select transistors on the bottom side of the block. Block 1 is a corner block at the top-left, which is encompassed by isolation area on the right side, the edge of the memory array on the left side, contact strapping on the bottom side of the block, and the array edge near the select transistors on the top side. Block 13 is a corner group at the bottom-left, which is encompassed by isolation area on the right side, the edge of the memory array on the left side, contact strapping on the top side of the block, and the edge near the select transistors on the bottom side. Each of the blocks has 8 word-lines (the horizontal lines in the figure) and 16 bit-lines (the vertical lines in the figure). The different cell types A-L are marked on some exemplary cells within the array.

When performing the optical lithography, cells that have different cell types, although are designed substantially the same, and may appear substantially similar on the reticle, may result with different geometries on the silicon die due to optical phenomena which is affected by different uniformity of the surrounding area of cells of different cell types. The result of different geometries of the cell structure may impact the electrical behavior of the cell such as the threshold voltage (Vt). The different uniformity of the surrounding area of cells of different cell types may affect the electrical behavior of the different cells also in other ways as explained above, such as, different chemical reaction speed during the etching process step, different doping migration at high temperatures, different mechanical stress, cross interaction of neighboring cells.

The different electrical behavior of the cells may lead to lower product reliability and even affect functionality.

The present invention is a system, method and circuit for operating an array of memory cells. According to some embodiments of the present invention, the nonvolatile memory array may include memory cells of different types which may be characterized by the location of the cell within the array. According to some embodiments of the present invention, a cell type may be characterized by being adjacent to the memory array vertical edge. According to some embodiments of the present invention, a cell type may be characterized by being adjacent to the memory array horizontal edge. According to some embodiments of the present invention, a cell type may be characterized by being adjacent to a bit-line strapping area. According to some embodiments of the present invention, a cell type may be characterized by being adjacent to the select area. According to some embodiments of the present invention, a cell type may be characterized by being adjacent to an isolation area. According to some embodiments of the present invention, a cell type may be characterized by not being adjacent to any of vertical edge, horizontal edge, bit-line strapping area, select area, isolation area. According to some embodiments of the present invention, a cell type may be characterized by being adjacent to two of vertical edge, horizontal edge, bit-line strapping area, select area, isolation area.

In order to achieve proper operation of the memory array there may be a need to properly verify the logical state of any of the nonvolatile memory cells of the array despite the fact that the electrical characteristics (e.g. threshold voltage) of the cells may be different due to differences in the surrounding area of the cell, which are associated with the cell type.

According to some embodiments of the present invention, the reference cell structure of a nonvolatile memory may include an array structure of reference cells. According to some embodiments of the present invention, the reference cell array structure may be constructed in a way to include one or more cell(s) of the desired cell types. According to some embodiments of the present invention, the reference cell array structure may include the minimal number of cells that still provide at least one cell of each of the at least one desired type.

Figure 6:
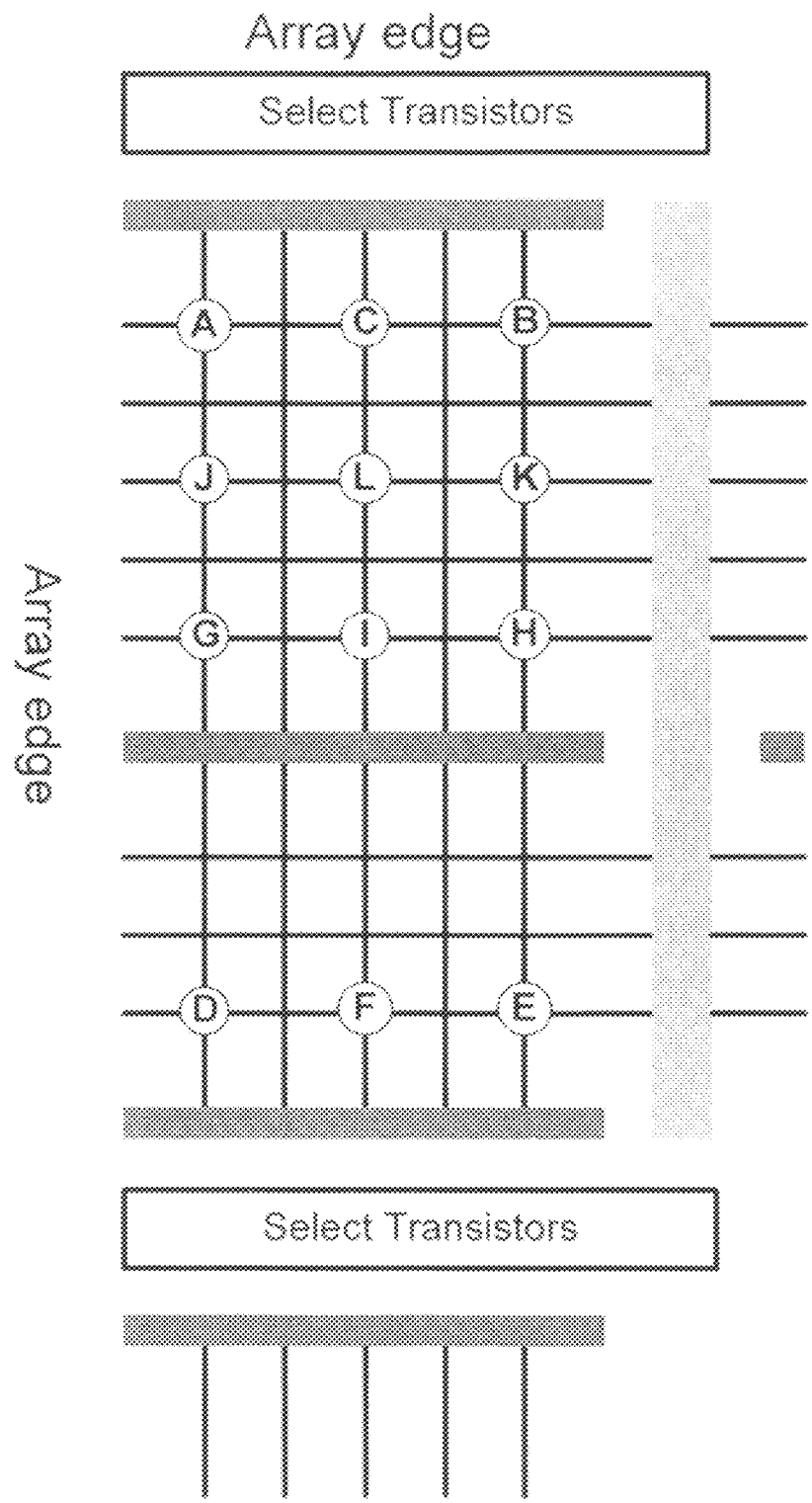
FIG. 6 shows an illustration of an exemplary reference cell array structure according to some embodiments of the present invention.

FIG. 6 is a schematic exemplary description of a reference cell array structure according to some embodiments of the present invention. In this example the reference cell array structure includes one select area at the vertical edge of the array, one internal select area, a horizontal edge, an isolation area, and three bit-line strapping areas, one near the vertical edge, one near the internal select area, and one in-between. The number of word-lines in the upper word-line group is 5, and in the lower word-line group there are 3. The number of Bit-lines is 5. As can be seen from the figure, the small reference cell array structure may include the different cell types.

According to some embodiments of the present invention, upon a request from the external interface to access a word or a cell in the memory array, the controller may determine the type of cell or cells which are to be accessed and select a reference cell or cells of the same type or types from the reference cell array structure for comparing with the accessed cell. Since the accessed cell whose logical value is to be verified, and the selected reference cell are of the same type, their electrical characteristics may be substantially similar, and their threshold voltage may be substantially close to each other.

In some cases it may be preferable to design a reference cell which is not at an edge of an array, or does not have a similar nearby surrounding structure to an edge cell, but is designed to have electrical characteristics which are similar to such a cell. In other cases it may be preferable to design a reference signal which is constructed from a combination of several cells. Such a reference signal may have electrical characteristics which are similar to an edge cell.

According to some embodiments of the present invention, the logical state of a memory cell may be verified by comparing the current of the memory cell to be verified, with the current of a reference cell which is designed so that it has substantially similar electrical characteristics to the verified cell.

According to some embodiments of the present invention, the logical state of a memory cell may be verified by comparing the current of the memory cell to be verified, with the current of a combination of reference cells which are designed so that they have substantially similar electrical characteristics to the verified cell.

Figure 7:
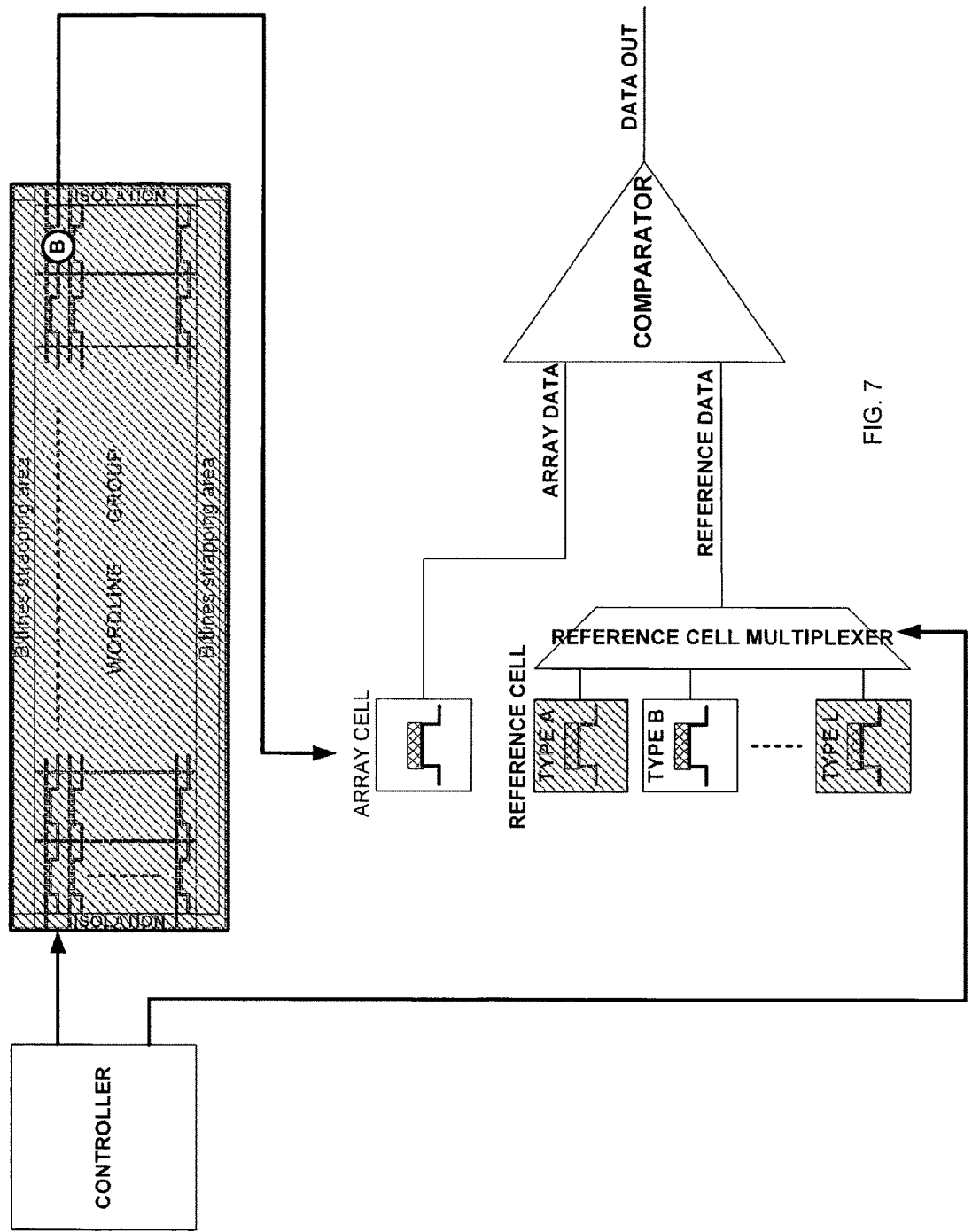
FIG. 7 shows a block diagram illustration of an exemplary circuit for verifying a logical state of a nonvolatile memory array cell by comparing it to the same type reference cell.

FIG. 7 is a schematic exemplary description of a circuit for verifying a cell's logical state according to some embodiments of the present invention. According to this example, there are 12 reference cells of types A, B, C, . . . L. The 12 reference cells are fed into a multiplexer. The select lines of the multiplexer are controlled by the controller which also selects the cell in the memory array whose logical value is to be verified. In this example, the logical value of a cell of type 'B' in the memory array is verified. The controller instructs the multiplexer to select a type B reference cell. The comparator compares the current of the type B memory cell whose logical value is to be verified, with the current of the type B reference cell which was selected by the multiplexer.

A reference cell may have substantially similar electrical characteristic as an array edge cell either by placing the reference cell in a similar nearby surrounding structure, or by designing the reference cell to behave in a similar way to an edge cell by, for instance, programming the reference cell to a different initial state.

FIG. 8 shows an exemplary illustration of edge cells margin improvement according to some embodiments of the present invention. The Vt distribution of non-edge cells is shown in a continuous line, and the Vt distribution of the edge cells is shown in a dashed line. As can be seen from the drawing, the edge cells, due to their nature, are programmed more aggressively and therefore have a higher level of the Vt distribution than the non-edge cells. In FIG. 8A of this example, there is one read reference cell (RD) for both the non-edge cells and the edge cells, therefore the read margin of the erased edge cells is smaller than the read margin of the non-edge cells (the distance of the erased edge core cell relative to the RD reference location versus the distance of the erased non-edge core cell relative to the RD reference location). In FIG. 8B there is one read reference cell for non-edge cells, and a special read reference cell designed at a higher level for edge cells, as can be seen from the drawing, the margin of the erased edge-cells and non-edge cells from their respective reference cells is approximately the same and therefore there is no margin loss.

FIG. 9 shows another exemplary illustration of edge cells margin improvement according to some embodiments of the present invention. In this example end-of-life data retention after cycling is demonstrated. FIG. 9A shows a case in which edge core cells show higher retention after cycling compared to non-edge cells and therefore the edge core cells at the end of life have reduced margin relative to the read reference level. According to this example, both the edge cells and the non-edge cells are programmed using a single program verify reference cell. At the beginning of the array lifetime the data retention of the edge and non-edge cells is approximately similar, but at the end-of-life the edge cells have higher data retention compared to non-edge cells and therefore have lower margin from the read reference cell. FIG. 9B shows an example in which the edge cells are programmed to a higher level using a special program verify reference cell which has a higher level than the program verify reference cell used to program the non-edge cells. By programming the edge cells to a higher level, compensation to higher end-of-life data retention is achieved.

While certain features of the invention have been illustrated and described herein, many modifications, substitutions, changes, and equivalents will now occur to those skilled in the art. It is, therefore, to be understood that the appended claims are intended to cover all such modifications and changes as fall within the true spirit of the invention.

While certain features of the invention have been illustrated and described herein, many modifications, substitutions, changes, and equivalents will now occur to those skilled in the art. It is, therefore, to be understood that the appended claims are intended to cover all such modifications and changes as fall within the true spirit of the invention.

What is claimed:

1. A nonvolatile memory (NVM) device comprising:
an array of NVM data cells including one or more periphery data cells and one or more non-periphery cells;
a set of NVM reference structures wherein at least a first reference structure is substantially similar to said one or more periphery data cells and an at least second reference structure is substantially similar to said one or more non-periphery data cells; and
array control circuitry to evaluate a state of said one or more periphery data cells with respect to said at least first reference structure and to evaluate a state of said one or more non-periphery data cells with respect to said at least second reference structure.

2. The device according to claim 1, wherein said array control circuitry includes control logic adapted to select a reference structure associated with periphery NVM cells when evaluating a state of a periphery data cell.

3. The device according to claim 1, wherein said array control circuitry includes control logic adapted to select a reference structure associated with non-periphery NVM cells when evaluating a state of a non-periphery data cell.

4. The device according to claim 1, wherein said reference structures are NVM reference cells.

5. The device according to claim 4, wherein a NVM reference cell associated with periphery NVM cells is a periphery NVM cell located at a periphery of said NVM array.

6. The device according to claim 4, wherein a NVM reference cell associated with non-periphery NVM cells is a non-periphery cell surrounded on four sides by other NVM cells.

7. The device according to claim 1, wherein said array control circuitry is further adapted to evaluate a state of the one or more periphery data cells using a second sense path configuration different from a first sense path configuration used for evaluating non-periphery cells.

8. The device according to claim 7, wherein said array control circuitry is adapted to modify one or more sense path configuration factors selected from the group of factors consisting of: (1) reference structure selection, (2) sense path routing, (3) sense amplifier selection, (4) sense amplifier settings, (5) reference structure voltage offset element selection, (6) reference structure current offset element selection, (7) data cell voltage offset element selection, and (8) data cell current offset element selection.

9. The device according to claim 8, wherein said control circuitry is adapted to determine whether a given NVM cell to be evaluated is a periphery cell based on a parameter of an array address of the given NVM cell.

10. The device according to claim 1 wherein said array control circuitry comprises circuitry to program said at least first reference structure to an initial state similar to that of said one or more periphery data cells.

11. The device according to claim 1 wherein a surrounding area of said at least first reference structure is substantially similar to a surrounding area of said one or more periphery data cells and wherein a surrounding area of said at least second reference cell is substantially similar to a surrounding area of said one or more non-periphery data cells.

12. A method operating an array of nonvolatile memory (NVM) cells including one or more periphery data cells, one or more non-periphery cells, and a set of NVM reference structures wherein at least a first reference structure is substantially similar to said one or more periphery data cells and an at least second reference structure is substantially similar to said one or more non-periphery data cell, said method comprising:
evaluating a state of the one or more periphery data cells with respect to the at least first reference structure; and
evaluating a state of the one or more non-periphery data cells with respect to the at least second reference structure.

13. The method according to claim 12, further comprising selecting a reference structure associated with periphery NVM cells when evaluating a state of a periphery data cell.

14. The method according to claim 12, further comprising selecting a reference structure associated with non-periphery NVM cells when evaluating a state of a non-periphery data cell.

15. The method according to claim 12, wherein said reference structures are NVM reference cells.

16. The method according to claim 15, wherein an NVM reference cell associated with periphery NVM cells is a periphery NVM cell located at a periphery of said NVM array.

17. The method according to claim 15, wherein an NVM reference cell associated with non-periphery NVM cells is a non-periphery cell surrounded on four sides by other NVM cells.

18. The method according to claim 12, further comprising evaluating a state of the one or more periphery data cells using a second sense path configuration different from a first sense path configuration used for evaluating non-periphery cells.

19. The method according to claim 18, wherein sense path configuration is modified by selecting a configuration factor from the group of factors consisting of: (1) reference structure selection, (2) sense path routing, (3) sense amplifier selection, (4) sense amplifier settings, (5) reference structure voltage offset element selection, (6) reference structure current offset element selection, (7) data cell voltage offset element selection, and (8) data cell current offset element selection.

20. The method according to claim 19, further comprising determining whether a given NVM cell to be evaluated is a periphery cell based on a parameter of an array address of the given NVM cell.

* * * * *